Nov. 6, 1951 D. H. MILLS ET AL 2,573,801

TUNING CONTROL

Filed Sept. 20, 1946 3 Sheets-Sheet 1

Inventors:
Norman F. Martin and
Donald H. Mills
By Clarence J. Loftus atty.

Nov. 6, 1951 D. H. MILLS ET AL 2,573,801

TUNING CONTROL

Filed Sept. 20, 1946 3 Sheets-Sheet 2

Inventors:
Norman F. Martin and
Donald H. Mills
By Clarence J. Loftus Atty.

Nov. 6, 1951

D. H. MILLS ET AL 2,573,801

TUNING CONTROL

Filed Sept. 20, 1946

3 Sheets-Sheet 3

INVENTORS:
NORMAN F. MARTIN
DONALD H. MILLS
Arthur A. Smith ATTY.

Patented Nov. 6, 1951 2,573,801

UNITED STATES PATENT OFFICE 2,573,801

TUNING CONTROL

Donald H. Mills and Norman F. Martin, Fort Wayne, Ind., assignors to The Magnavox Company, Fort Wayne, Ind., a corporation of Delaware Application September 20, 1946, Serial No. 698,370

7 Claims. (Cl. 74—10.33)

The present invention relates to a tuning control for a radio receiver, or particularly to a tuning control applied to a tuning element which is adapted to be moved to predetermined selected positions by a pushbutton mechanism.

In radio receivers having tuning elements moved to predetermined positions by pushbutton means, there is usually provided a manual tuning control for continuously varying the position of the tuning element to select radio stations other than those provided by the pushbutton mechanism. For such manual tuning control it is desirable to provide a relatively high ratio of drive between the tuning control and the tuning element. Such high ratio of drive, however, increases the difficulty of moving the pushbuttons. Accordingly, means must be provided for disengaging the manual control whenever the pushbutton control or mechanism is actuated.

It is an object of the present invention to provide in a tuning control for a radio receiver having a manually controlled pushbutton tuning device, means for providing a relatively high ratio of drive between the tuning control knob and the shaft of the tuning element, together with means for disengaging the manual tuning control whenever the pushbutton tuning device is actuated.

It is a further object of the present invention to provide in a tuning device means for automatically disconnecting the manual tuning control upon initial movement of the pushbutton device to reduce the pressure required to actuate the pushbuttons.

A further object of the present invention is to provide a simple economical tuning control having a muting switch actuated substantially prior to the movement of the tuning element or device in response to pushbutton actuation.

A still further object of the present invention is to provide in a pushbutton tuning device for a radio receiver a muting device which may be rendered ineffective during the individual adjustment of each pushbutton to a selected control position and which does not require any special operation to render it ineffective or effective.

Other and further objects of the present invention subsequently will become apparent by reference to the following description, taken in conjunction with the accompanying drawings, wherein.

Figure 1:
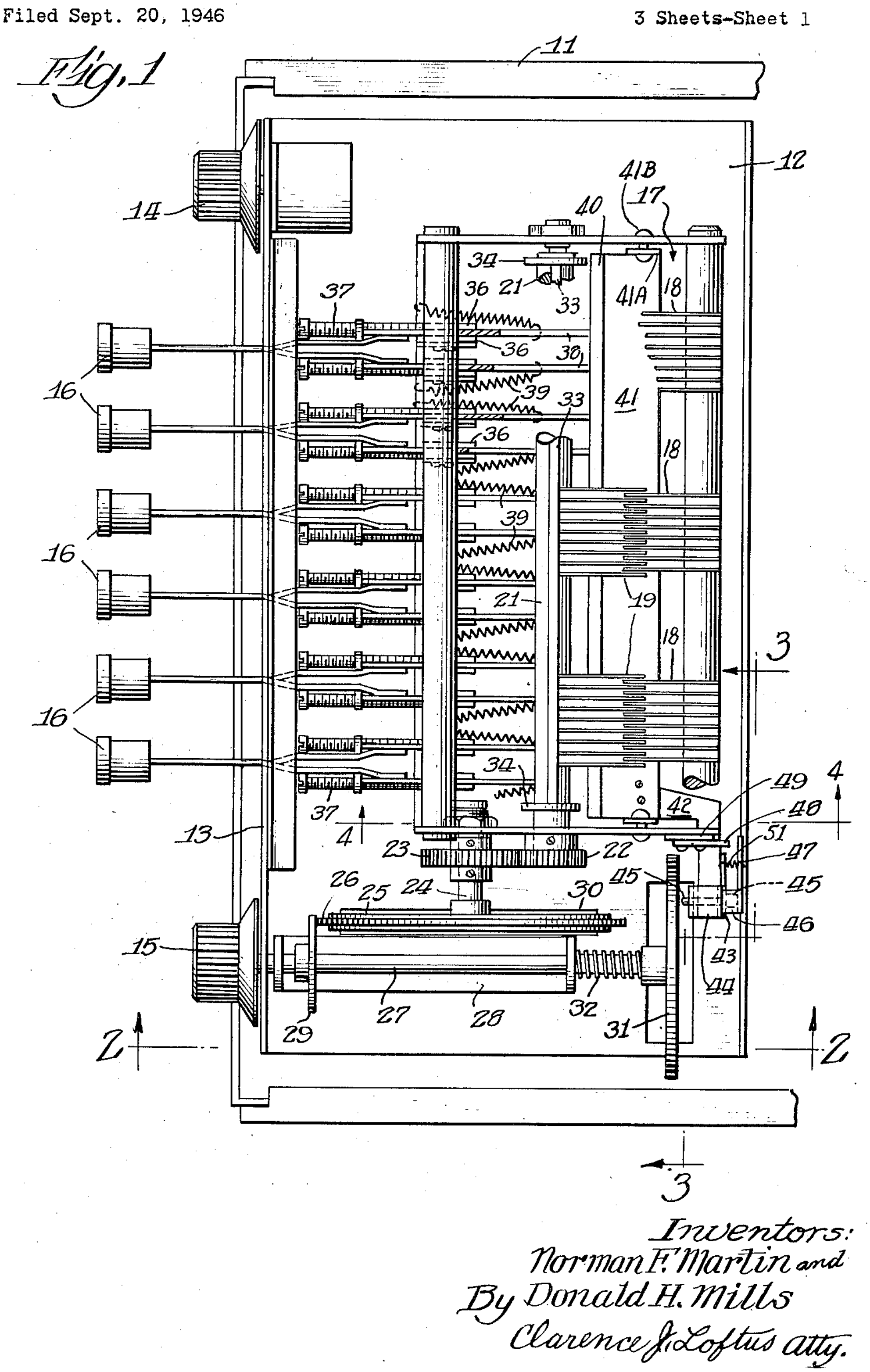
Figure 1 is a top or plan view of a tuning control embodying the present invention.

Referring to the drawings, there is shown a portion of a radio receiver cabinet 11 having a radio chassis 12 which is provided with an upright panel 13. The radio receiver is provided with a volume control knob 14 and a manual tuning control knob 15. The variable tuning element of the receiver is arranged to be actuated by a pushbutton mechanism having a plurality of pushbuttons 16. In the particular embodiment illustrated, as is apparent from Fig. 2, two rows of pushbuttons 16 arranged in pairs in vertical alignment are provided, although it is to be understood that the number and arrangement of the pushbuttons may be varied as desired, since of themselves they do not form the present invention.

The pushbutton 16 and manual tuning control knob 15 are arranged to actuate a variable tuning element or capacitor 17. The capacitor is provided with a plurality of sections comprising a plurality of stators 18 and a plurality of rotors 19. The rotors 19 are mounted on a rotor shaft 21 which carries a gear 22 which meshes with another gear 23 mounted on a stud shaft 24. The stud shaft 24 is suitably journaled in an end plate of the tuning capacitor 17 and carries at its outer extremity a drive wheel 25 which is provided with a resilient rim 26 which may be of rubber or similar material. The chassis in proximity of the drive wheel 25 is provided with an aperture or hole 30 so that a portion of the drive wheel 25 extends below the top surface of the chassis 12. The tuning knob 15 is mounted on a shaft 27 suitably supported in a bracket 28 which is secured to the top of the chassis 12 so that the shaft 27 is at right angles to the stud shaft 24 and the axes of the two shafts are in a common plane. Adjacent the front end of the shaft 27 there is provided a driving wheel 29 which normally engages the resilient rim 26 of the large driving wheel 25. At the other end of the shaft 27 there is provided a flywheel 31 which provides sufficient inertia for spinning the knob 15 when it is desired to move the tuning control rapidly from one region to another region some distance away, as indicated by the dial pointer or scale provided for the radio receiver. The shaft 27 is biased in a rearward direction by a coil spring 32 which surrounds a portion of the shaft 27 and which engages the hub of the flywheel 31 and a portion of the supporting bracket 28.

Each pushbutton 16 is connected to a reciprocable member which engages cam follower bars 33 which extend between end plates 34 and surround the condenser shaft 21. The cam follower bars 33 are engaged by adjustably positioned cam members 35. The cam members 35 are supported in position by a pair of levers 36 which may be locked in position by suitable means connected to an adjustable set screw 37. Whenever it is desired to provide a new predetermined position for the tuning element in response to the actuation of a particular pushbutton 16, the set screw 37 is loosened so as to free the cam member 35. Thereupon the tuning element or condenser 17 is rotated so as to cause the receiver to bring in the desired radio station. By holding the condenser 17 in position and then actuating the pushbutton 16, the cam 35 will seek the proper position by its engagement with the transversely arranged cam follower bars 33. When the cam 35 has been moved to its new position, the set screw 37 may be tightened so as to lock the cam in its new position, whereupon subsequent actuation of the pushbutton will therefore cause the tuning element to be moved to the desired preselected position.

Figure 2:
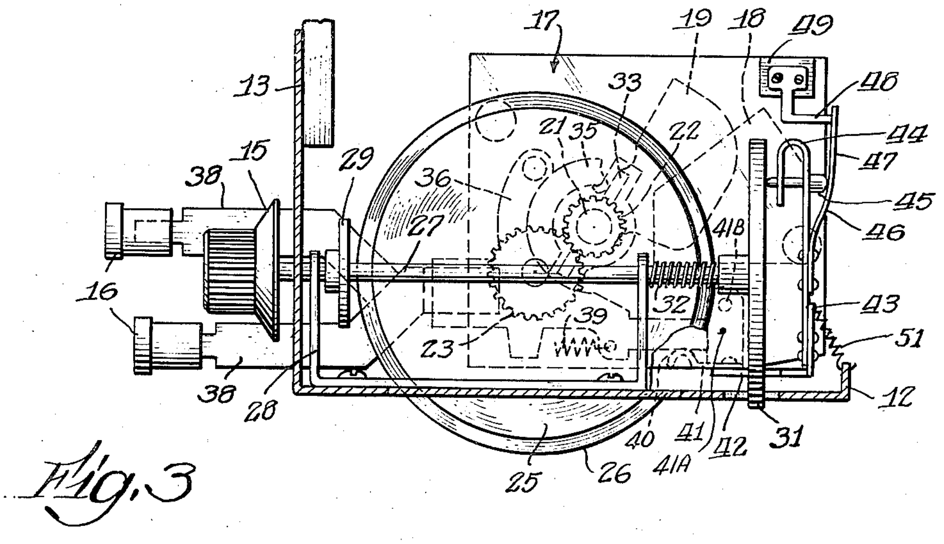
Fig. 2 is an end view of the tuning control shown in Fig. 1.
Figure 3:
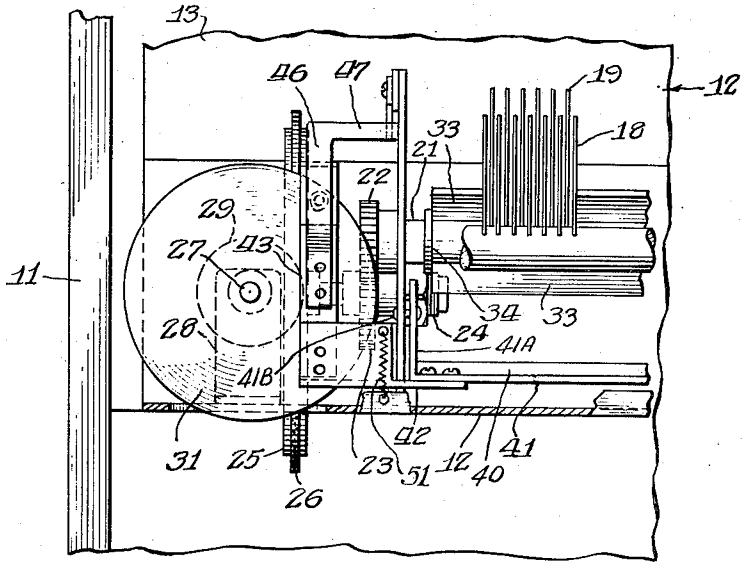
Fig. 3 is a rear view of a portion of the tuning control shown in the previous figures.
Figure 4:
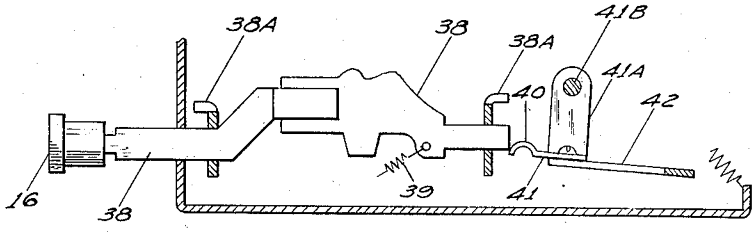
Figs. 4 and 5 are sectional views on line 4—4 of Fig. 1 with certain parts omitted.
Figure 5:
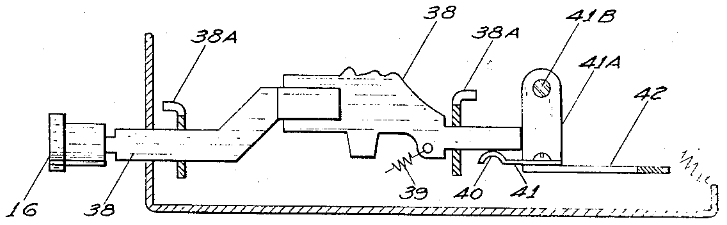

The levers 36 and the set screws 37 are supported on transversely arranged bars 38 suitably supported by guides such, for example, as guides 38A (shown in Figs. 4 and 5, only, because they are obscured in the other figures) and biased toward the forward position by springs 39. The rear extremity of each bar 38, shortly after its initial movement by actuation of a pushbutton 16, is arranged to engage cam surface 40 on a pivotally mounted treadle bar 41 which comprises a turned up portion 41A at each end thereof. Each turned up portion may be provided with a pivot 41B. The treadle bar 41 is actuated prior to the time that the cam member 35 engages either one of the transversely arranged cam follower members 33. The treadle bar 41 carries a rearward extension member or bar 42 which has an upright member 43. The upright member 43 is reversely curved in a generally U-shaped manner at 44 and carries a reciprocable pin 45 which has a slight clearance from the rear surface of the flywheel 31. The upright member 43 also carries a spring 46 which engages the other end of the pin 45 so as to bias the pin toward the flywheel 31. The spring 46 is sufficiently stiff so that when the treadle 41 is actuated in response to the movement of a pushbutton 16, as illustrated in Fig. 2, the pin 45 bears against the flywheel 31 so as to compress the spring 32 and to move the shaft 27 toward the front. In so moving the shaft 27 the driving wheel 29 is disengaged from the resilient rim 26 of the large driving wheel 25. Thus the high ratio driving connection between the tuning knob 15 and the tuning element is disengaged.

The spring 46 has an arm 47 which is adapted to engage a rearwardly extending contact member 48 suitably mounted by an insulating block 49 adjacent one end of the tuning condenser 17. The extension 47 of the spring 46, when it engages the contact 48, is connected in a circuit which mutes the radio receiver so that the following or subsequent movement of the rotors 19 of the tuning condenser 17 will not cause various intervening radio stations to be heard when the tuning element is moved from one position to another.

After the pushbutton 16 has been moved to its rearmost limit as illustrated in Fig. 2, the spring 39 restores the pushbutton to its forward position, whereupon the treadle bar 41 is restored and the spring 32 moves the shaft 27 in a rearward position, thus to re-engage the wheels 29 and 25.

This re-engagement of the wheels 29 and 25 effectively applies a brake to the tuning condenser rotor so that any vibration cannot move the tuning condenser from its predetermined selected position.

In order to adjust a pushbutton 16 to a new station position, the manual tuning control 15 is first employed to move the condenser 17 to the proper position. Thereafter, as previously described, the set screw 37 and the pushbutton 16 are actuated. In order to prevent movement of the tuning condenser 17 during this operation, slight rearward pressure is applied to the tuning control 15. This rearward pressure applied sufficient braking action to the wheel 25 so as to preclude movement of the rotor shaft 21 of the tuning condenser 17 when the cam 35 engages the cam follower surfaces 33 while seeking its new position. The rearward pressure on the tuning control 15 is transmitted through the flywheel 31 to the pin 45 which deflects spring 46, thus opening the contacts 47 and 48 so that in spite of the fact that the treadle bar is actuated in opposition to spring 51, the radio receiver is not muted.

The disengagement of the manual tuning control knob during the operation of the pushbuttons reduces the pressure necessary to actuate the pushbutton and reduces the wear on the mechanism to provide an overall smoother operation. Any suitable type of pointer and dial may be employed with the arrangement shown and described, and hence no particular dial and pointer mechanism has been illustrated.

The spring 51 which has one end secured to the upturned portion of the base 12 is connected to the member 42 which in turn is secured to a treadle bar 17. Hence the spring 51 returns the treadle bar to original position after the pushbutton has been released. In the drawings the preferred embodiment has been shown as having a wheel 25 provided with a resilient rim 26 which is engaged by a smaller wheel 29. It will readily be appreciated by those skilled in the art that any other arrangement might be employed where a resilient surface is interposed between the wheels 25 and 29 and hence if desired the wheel 29 may be provided with a resilient surface for engaging the rim of the wheel 25.

While for the purpose of illustrating and describing the present invention a preferred embodiment has been shown in the drawings, it is to be understood that such disclosure does not constitute a limitation, since such variations in the instrumentalities employed and in their arrangement are contemplated as may be commensurate with the spirit and scope of the invention as set forth in the following claims.

Having thus described our invention, we claim:

1. In a radio receiver, a combination comprising a rotatable tuning element having a relatively large driving wheel provided with a resilient rim, a manually rotatable tuning control shaft positioned at right angles to said wheel, the axes of said shaft and said wheel being in a common plane, a relatively small disk wheel mounted on said shaft for engagement with said resilient rim, spring means biasing said latter wheel against the resilient rim of said first wheel, a flywheel mounted on said shaft, pushbutton means for moving said tuning element to selected predetermined positions, and means movable through its entire excursion responsive to the initial movement of said pushbutton means for engaging said flywheel thereby to disengage said disk wheel from the rim of said first wheel.

2. In a radio receiver, the combination comprising a rotatable tuning element having a relatively large driving wheel, said wheel having a resilient rim, a manually rotatable tuning control shaft positioned adjacent to said wheel, a relatively small disc wheel mounted on said shaft at one end thereof adjacent said resilient rim, brackets freely engaging and supporting said shaft for rotary and longitudinal movement, a fly wheel mounted on the other end of said shaft, spring means engaging one of said brackets and said fly wheel for biasing said shaft in a direction normally to engage said small wheel with said resilient rim, push button means for moving said tuning element to select its predetermined positions, and pivoted means including a cam surface in operative relation with said push button means and in the plane thereof, said cam surface being formed to move through its entire excursion during the initial movement of said push button means, said pivoted means extending into overlapping relation with said fly wheel for engaging said fly wheel and moving said disc wheel away from said rim when one of said push button means is operated.

3. In a radio receiver, the combination comprising a rotatable tuning element having a relatively large driving wheel, a manually rotatable tuning control shaft positioned adjacent to said wheel, a relatively small wheel mounted on said shaft at one end thereof adjacent said large wheel, means for freely engaging and supporting said shaft for rotary and longitudinal movement, a fly wheel mounted on the other end of said shaft, spring means engaging said supporting means and said fly wheel for biasing said shaft in a direction normally to engage said small wheel with said large wheel, push button means for moving said tuning element to select its predetermined positions, a treadle bar including a cam surface responsive to said push button means, said cam surface being formed to move said bar through its entire excursion during the initial movement of said push button means, said treadle bar extending into operative relation with said fly wheel for engaging said fly wheel and moving said small wheel away from said driving wheel when said push button means is operated.

4. In a radio receiver, the combination comprising a rotatable tuning element having a relatively large driving wheel, a manually rotatable tuning control shaft positioned adjacent to said wheel, a relatively small wheel mounted on said shaft at one end thereof adjacent said large wheel, means for freely engaging and supporting said shaft for rotary and longitudinal movement, a fly wheel mounted on the other end of said shaft, spring means engaging said supporting means and said fly wheel for biasing said shaft in a direction normally to engage said small wheel with said large wheel, push button means for moving said tuning element to select its predetermined positions, a treadle bar including a cam surface responsive to said push button means, said cam surface being formed to move said bar through its entire excursion during the initial movement of said push button means, said treadle bar extending into operative relation with said fly wheel, a pin movably mounted in said bar for engaging said fly wheel and moving said small wheel away from said large wheel when said push button means is operated, and a spring fixed to said bar and extending over one end of said pin whereby said shaft may be moved longitudinally in one direction by said treadle bar or independently of said treadle bar in the other direction.

5. In a radio receiver, the combination comprising a rotatable tuning element having a relatively large driving wheel, a manually rotatable tuning control shaft positioned adjacent to said wheel, a relatively small wheel mounted on said shaft at one end thereof adjacent said large wheel, means for freely engaging and supporting said shaft for rotary and longitudinal movement, a fly wheel mounted on the other end of said shaft, spring means engaging said supporting means and said fly wheel for biasing said shaft in a direction normally to engage said small wheel with said large wheel, push button means for moving said tuning element to select its predetermined positions, a treadle bar responsive to said push button means and formed to move through its entire excursion during the initial movement of said push button means, said treadle bar extending into operative relation with said fly wheel, and spring biased means movably mounted in said bar for engaging said fly wheel and moving said small wheel away from said large wheel when said push button means is operated, whereby said shaft may be moved longitudinally in one direction by said treadle bar or independently of said bar in the other direction.

6. In a radio receiver, the combination comprising a rotatable tuning element having a relatively large driving wheel, said wheel having a resilient rim, a manually rotatable tuning control shaft positioned adjacent to said wheel, a relatively small wheel mounted on said shaft at one end thereof adjacent said resilient rim, means for freely engaging and supporting said shaft for rotary and longitudinal movement, a fly wheel mounted on the other end of said shaft, spring means engaging said supporting means and said fly wheel for biasing said shaft in a direction normally to engage said small wheel with said resilient rim, push button means for moving said tuning element to select its predetermined positions and including a plurality of levers aligned in a common plane, a treadle bar including a cam surface in the plane of said levers, said cam surface being formed to move said bar through its entire excursion during the initial movement of one of said levers, said treadle bar extending into overlapping and operative relation with said fly wheel, a pin movably mounted in said bar for engaging said fly wheel and moving said small wheel away from said rim when one of said levers is operated, and a spring contact fixed to said bar and extending over one end of said pin whereby said contact may be operated by said treadle bar or in response to longitudinal movement of said fly wheel.

7. In a radio receiver, the combination comprising a rotatable tuning element having a relatively large driving wheel, said wheel having a resilient rim, a manually rotatable tuning control shaft positioned adjacent to said wheel, a relatively small wheel mounted on said shaft at one end thereof adjacent said resilient rim, brackets freely engaging and supporting said shaft for rotary and longitudinal movement, a fly wheel mounted on the other end of said shaft, spring means engaging one of said brackets and said fly wheel for biasing said shaft in a direction normally to engage said small wheel with said resilient rim, push button means for moving said tuning element to select its predetermined positions and including a plurality of levers aligned in a common plane, a treadle bar including a cam surface co-extensive with said levers and in the plane thereof, said cam surface being formed to move said bar through its entire excursion during the initial movement of one of said levers, said treadle bar extending into overlapping relation with said fly wheel and including a lever extending into operative relation with said fly wheel, a pin movably mounted in said lever for engaging said fly wheel and moving said small wheel away from said rim when one of said levers is operated, and a spring contact fixed to said lever and extending over one end of said pin whereby said contact may be operated by said treadle bar or in response to longitudinal movement of said fly wheel.

DONALD H. MILLS.
NORMAN F. MARTIN.

REFERENCES CITED

The following references are of record in the file of this patent:

UNITED STATES PATENTS

| Number | Name | Date |
|---|---|---|
| 1,925,651 | Bird | Sept. 5, 1933 |
| 1,960,103 | Fierce | May 22, 1934 |
| 2,151,595 | Grimditch et al. | Mar. 21, 1939 |
| 2,153,865 | Gersch | Apr. 11, 1939 |
| 2,214,506 | Manning et al. | Sept. 10, 1940 |
| 2,278,648 | De Roo | Apr. 7, 1942 |
| 2,330,833 | Marholz et al. | Oct. 5, 1943 |
| 2,350,543 | Wells | June 6, 1944 |
| 2,351,443 | Metcalfe et al. | June 13, 1944 |
| 2,366,573 | Swallow | Jan. 2, 1945 |
| 2,372,099 | McGarvey | Mar. 20, 1945 |
| 2,383,338 | Newman | Aug. 21, 1945 |